United States Patent [19]

Eaton et al.

[11] Patent Number: 6,157,207
[45] Date of Patent: Dec. 5, 2000

[54] PROTECTION OF LOGIC MODULES IN A FIELD PROGRAMMABLE GATE ARRAY DURING ANTIFUSE PROGRAMMING

[75] Inventors: David D. Eaton, San Jose; Sudarshan Varshney; Paige A. Kolze, both of Mountain View, all of Calif.

[73] Assignee: QuickLogic Corporation, Sunnyvale, Calif.

[21] Appl. No.: 09/076,367

[22] Filed: May 11, 1998

[51] Int. Cl.[7] .......................... G06F 7/38; H03K 19/177
[52] U.S. Cl. ............................... 326/38; 326/37; 326/38; 326/39; 326/40; 326/41
[58] Field of Search ................................. 326/38, 41, 39, 326/101; 327/525; 395/500.17, 500.18

[56] References Cited

U.S. PATENT DOCUMENTS

| | | |
|---|---|---|
| 4,873,459 | 10/1989 | El Gamal et al. . |
| 5,122,685 | 6/1992 | Chan et al. . |
| 5,235,221 | 8/1993 | Douglas et al. ......................... 307/465 |
| 5,327,024 | 7/1994 | Cox . |
| 5,341,030 | 8/1994 | Galbraith . |
| 5,349,248 | 9/1994 | Parlour et al. ......................... 307/465 |
| 5,362,676 | 11/1994 | Gordon et al. . |
| 5,424,655 | 6/1995 | Chua . |
| 5,495,181 | 2/1996 | Kolze . |
| 5,502,315 | 3/1996 | Chua et al. . |
| 5,534,793 | 7/1996 | Nasserbakht . |
| 5,537,056 | 7/1996 | McCollum . |
| 5,544,070 | 8/1996 | Cox et al. . |
| 5,557,136 | 9/1996 | Gordon et al. . |
| 5,600,262 | 2/1997 | Kolze ...................................... 326/38 |
| 5,661,412 | 8/1997 | Chawla et al. . |
| 5,682,106 | 10/1997 | Cox et al. ............................... 326/39 |
| 5,701,027 | 12/1997 | Gordon et al. . |
| 5,811,336 | 9/1998 | Kasai ..................................... 438/271 |
| 5,945,840 | 8/1999 | Cowles et al. ........................... 326/38 |

OTHER PUBLICATIONS

QuickLogic 1996/97 Data Book, pp. i through vi, 1–5 through 1–16, 2–1 through 2–11, 2–13 through 2–18, 3–1 through 3–14, 3–15 through 3–23, 6–33 through 6–36 (1996/97).

Actel 1996 FPGA Data Book And Design Guide, pp. 4–1 through 4–7, 4–95 through 4–100, 4–115 through 4–121, 4–113 through 4–144, 4–151 through 4–215, 7–1 through 7–8 (Apr. 1996).

Actel 1998 54SX Family FPGA Preliminary v1.0 Data Sheet, pp. 1–35 (Mar. 1998).

*Primary Examiner*—Michael Tokar
*Assistant Examiner*—Vibol Tan
*Attorney, Agent, or Firm*—Skjerven Morrill MacPherson LLP

[57] ABSTRACT

To protect logic module output devices from high voltages, logic modules are not powered during antifuse programming. In some embodiments, two separate power input terminals VCC1 and VCC2 are provided: power input terminal VCC1 being coupled to power the logic modules, and power input terminal VCC2 being coupled to power the programming control circuitry. Power terminal VCC1 is left floating or is grounded during antifuse programming such that the logic modules are not powered but such that the programming circuitry is powered during antifuse programming via the second power terminal VCC2. Logic module output protection transistors are not required nor is the associated charge pump. Because the logic module input devices are not powered, a current surge through the input devices on power up does not occur and an internal disable signal and associated circuitry is not required. In one embodiment, the field programmable gate array is made smaller because it has no internal disable signal and associated circuitry, no logic module output protection transistors, and no charge pump that operates during normal circuit operation. In embodiments, power input terminal VCC2 is a high voltage compatible power input terminal.

37 Claims, 8 Drawing Sheets

PROTECTION OF LOGIC MODULES IN A FIELD PROGRAMMABLE GATE ARRAY DURING ANTIFUSE PROGRAMMING

BACKGROUND INFORMATION

A field programmable gate array is a versatile integrated circuit chip, the internal circuitry of which may be configured by an individual user to realize a user-specific circuit. To configure a field programmable gate array, the user configures an on-chip interconnect structure of the field programmable gate array so that selected inputs and selected outputs of selected on-chip logic components are connected together in such a way that the resulting circuit is the user-specific circuit desired by the user. For additional background on antifuse-based field programmable gate array structures, the reader is referred to: U.S. Pat. Nos. 5,495,181, 5,424,655, 5,122,685, 5,327,024, 5,055,718, 4,873,459; U.S. patent application Ser. No. 08/677,783 entitled "Interface Cell For A Programmable Integrated Circuit Employing Antifuses," filed Jun. 21, 1996 by Paige A. Kolze et al., now U.S. Pat. No. 5,900,742, issued May 4, 1999; the 1994 QuickLogic Data Book; the 1996 Actel FPGA Data Book and Design Guide; and the book entitled "Field-Programmable Gate Arrays" by Stephen Brown et al., Kluwer Academic Publishers (1992) (the subject matter of these documents is incorporated herein by reference).

FIG. 1 (Prior Art) is a top down diagram of a field programmable gate array (FPGA) 1 including a logic array 2, programming control circuits 3, output drivers 4 and output terminals 5, a supply voltage power input terminal (VCC) 6, a ground terminal (GND) 7, and a high voltage compatibility power input terminal (HVC) 8. Logic array 2 includes a plurality of logic modules 9 arranged in rows and columns as well as a programmable interconnect structure 10 employing antifuses disposed in the spaces between the logic modules. Antifuses in the interconnect structure are programmed by putting the FPGA into a programming mode and then loading programming data serially from a terminal (not shown) of the FPGA into the programming control circuits 3. The programming control circuits 3 cause a programming voltage Vpp (for example, 10.5 volts) received on a programming voltage terminal VPP (not shown) of the FPGA to be imposed across a selected antifuse in the interconnect structure such that the antifuse "programs" to form a permanent low resistance connection between two signal conductors of the interconnect structure. The antifuses to be programmed to realize the user-specific circuit are programmed under the control of the programming control circuits. For additional background on the structure of the programming control circuits and associated programming structures and methods, the reader is referred to: U.S. patent application Ser. No. 08/667,702 entitled "Programming Architecture For A Programmable Integrated Circuit Employing Antifuses", filed Jun. 21, 1996 by Paige A. Kolze, now U. S. Pat. No. 5,825,201, issued Oct. 20, 1998 (the subject matter of which is incorporated herein by reference).

FIG. 2 (Prior Art) is a simplified diagram of parts of two logic modules 11 and 12 of FPGA 1. The output node 13 of the output device 14 of logic module 11 is coupled to input lead 15 of an input logic device 16 of logic module 12 via high voltage output protection transistors 17 and 18, horizontally extending signal conductor 19, programmed cross antifuse 20, vertically extending signal conductor 21, programmed cross antifuse 22, horizontally extending signal conductor 23, programmed cross antifuse 24, vertically extending signal conductor 25, programmed cross antifuse 26, and horizontally extending signal conductor 27. This particular path through the interconnect structure is chosen for explanatory purposes. Input logic device 16 drives a select input of a three multiplexer structure such as disclosed in FIG. 3E of U.S. Pat. No. 5,424,655 (the subject matter of which is incorporated herein by reference).

During antifuse programming, a programming voltage (for example, 10.5 volts) may be present on various of the signal conductors of the interconnect structure. For example, a 10.5 volt programming voltage may be placed on horizontal signal conductor 19 while vertical signal conductor 21 is grounded such that the 10.5 programming voltage appears across cross antifuse 20 such that antifuse 20 is programmed. Without high voltage output protection transistors 17 and 18 isolating the high programming voltage from the low voltage logic transistors 28 and 29 of the output device 14, the low voltage logic transistors 28 and 29 could be damaged.

FIG. 3 illustrates one way such damage could occur. To impose the 10.5 volt programming voltage across cross antifuse 20, a 10.5 volt programming voltage is placed on horizontal signal conductor 19. FIG. 4 is a cross-sectional diagram of the low voltage P-channel pull-up transistor 28 of the output device 14 of logic module 11. Because the low voltage logic transistors 28 and 29 of the output device of the logic module are powered by a lower supply voltage (in this case 3.3 volts) and the N well 29A (transistor body) of the P-channel pull-up transistor 28 is coupled via contact 30 to the source region 31, the N well 29A is coupled to 3.3 volts and the P+ drain region 32A to N well 29A boundary is forward biased. To avoid this potentially harmful situation as well as other problems, the high voltage output protection transistors 17 and 18 are provided. The high voltage output protection transistors 17 and 18 are nonconductive during antifuse programming, thereby protecting the low voltage logic transistors 28 and 29 from damage. During normal circuit operation of the FPGA, the high voltage output protection transistors 17 and 18 are made conductive, thereby connecting the output node 13 of the output device 14 to the horizontally extending signal conductor 19. If only high voltage output protection transistor 17 were provided, then a digital logic high signal passing from output node 13 to horizontal signal conductor 19 would suffer a threshold drop due to the fact that the gate of transistor 17 is biased at supply voltage VCC. Another high voltage output protection transistor 18 whose gate is driven with a voltage that is greater than VCC is therefore provided. This higher charge pump voltage (VCP) is needed during normal circuit operation and is provided by an on-chip charge pump (not shown). The charge pump consumes space on the integrated circuit and consumes approximately 500 microamperes maximum of standby current (over the 0–70 degrees Celsius range) even if the other digital logic of the FPGA is sitting idle and not switching. This standby current drain is highly undesirable for low power and battery applications.

If the low voltage logic transistors 28 and 29 did not need to be protected from the high voltage on the signal conductors during programming, then two high voltage output protection transistors could be omitted from each logic module output. This would make the logic module smaller. Moreover, the charge pump could be omitted. This reduces the standby current consumption of the FPGA.

During power up of the FPGA, the supply voltage VCC and the charge pump voltage VCP supplied to the high voltage output protection transistors 17 and 18 will be at intermediate voltages for some period of time. These protection transistors 17 and 18 will therefore not be fully conductive and the output devices of the logic modules will not be fully coupled to the signal conductors of the interconnect structure. As a result, intermediate voltages may be present on the signal conductors of the interconnect structure and on the input leads of the logic module input devices. These intermediate voltages may cause an undesirable power current spike during power up through logic module input devices.

FIG. 5 (Prior Art) is a transistor level diagram of the NAND gate logic module input device 16. Input device 16 has three non-inverting input leads 32–34 and four inverting input leads 35, 15, 36 and 37. Transistors 38–45 form a four input NOR gate and transistors 46–53 form a four input NAND gate. If all the input leads 35, 15, 36 and 37 were, for example, floating and at intermediate voltage levels, all of P-channel transistors 38–41 would be partially conductive and all of N-channel transistors 42–45 would be partially conductive. Accordingly, a current would flow from supply voltage VCC at the source of transistor 38 (for example, 3.3 volts) through transistors 38–45 to ground at the source of transistors 42–45.

To prevent this situation, one of the input leads 37 is coupled to a hard wired internal disable signal (INTDIS). This INTDIS signal is initially high (substantially equal to VCC as VCC rises) during the power up period when the intermediate voltages may be present on the input device 16 input leads. For additional information on internal disable circuitry, see U.S. patent application Ser. No. 08/775,984 entitled "Power-Up Circuit For Field Programmable Gate Array," filed Jan. 3, 1997 by James M. Apland et al., now U.S. Pat No. 5,828,538, issued Oct. 27, 1998 (the subject matter of which is incorporated herein by reference). Providing this extra INTDIS signal adds two additional transistors 41 and 42 to each such logic module input device as well as the associated interconnect to connect all the logic module input devices to an INTDIS signal conductor. If the INTDIS signal were not needed, then transistors 41 and 42 could be omitted resulting in considerable die area savings.

Although the internal circuitry of FPGA 1 operates with a power supply voltage VCC (for example, 3.3 volts), the FPGA may be placed on a printed circuit board with other logic that has a higher power supply voltage. This other logic may therefore drive a digital logic high signal of, for example, 5.0 volts onto terminals of the FPGA. It is desired that the FPGA be able to receive such high voltage logic signals without failing, being damaged, or sinking too much current.

FIG. 6 (Prior Art) is a simplified diagram illustrating the output driver 4 including a P-channel pull-up transistor 54 and an N-channel pull-down transistor 55 as well as output terminal 5. Consider the situation where logic external to the FPGA drives a digital logic high of 5.0 volts onto output terminal 5, the output driver is powered with a lower supply voltage (for example, 3.3 volts), and the semiconductor body into which the P-channel pull-up transistor 54 is formed is biased at 3.3 volts. FIG. 7 is a cross-sectional diagram illustrating P-channel pull-up transistor 54 in this situation. The P+ drain region 56 to N well 57 boundary will be forward biased giving rise to a possible large flow of current 58 into output driver 4. Such a forward bias situation could damage the FPGA and/or clamp the voltage to which the external logic can drive terminal 5 for a digital logic level high.

High voltage compatibility power input terminal (HVC) 8 is therefore provided. If external logic is to be able to drive terminal 5 to a 5.0 volt digital logic high level, for example, then HVC terminal 8 is coupled to a 5.0 volt supply and the HVC terminal is coupled to the semiconductor body (N well 57) of the P-channel pull-up transistor 54 of the output driver 4. With N well 57 biased to 5.0 volts, the P+ drain to N well boundary is not forward biased when the external logic attempts to drive terminal 5 to 5.0 volts.

FIGS. 1, 6 and 7 illustrate output driver 4 in simplified form to clarify the explanation. FIG. 8 (Prior Art) is a circuit diagram of an actual output driver circuit. The output driver circuit includes a non-inverting input lead 59, an enable input lead 60 and an output lead 61. The semiconductor body of P-channel pull-up transistor 54 is coupled to the high voltage compatible input power terminal HVC 8 whereas its source is coupled to supply voltage power input terminal VCC 6. The circuitry 62 in the dashed box is a level shifting circuit.

SUMMARY

To protect the low voltage transistors of the output drivers of logic modules from high voltages and/or to enable proper antifuse programming, the logic modules are not powered during antifuse programming. In some embodiments, two separate power input terminals VCC1 and VCC2 are provided, power input terminal VCC1 being coupled to power the logic modules and power input terminal VCC2 being coupled to power the programming control circuitry. Power terminal VCC1 is left floating or is grounded during antifuse programming such that the logic modules are not powered but such that the programming circuitry is powered during antifuse programming via the second power terminal VCC2. Logic module output protection transistors are not required nor is the associated charge pump. Because the logic module input devices are not powered, a current surge through the input devices on power up does not occur and an internal disable signal INTDIS and associated circuitry is not required. In one embodiment, the field programmable gate array is made smaller because it has no internal disable signal and associated circuitry, no logic module output protection transistors, and no charge pump that operates during normal circuit operation. In another embodiment, the field programmable gate array is made smaller because it has no internal disable signal and associated circuitry and has smaller logic module input transistors. In some embodiments, power input terminal VCC2 is a high voltage compatible power input terminal. Other embodiments and methods are described in the detailed description section below. This summary does not purport to define the invention. The invention is defined by the claims.

DETAILED DESCRIPTION OF THE PREFERRED EMBODIMENTS

Figure 9:
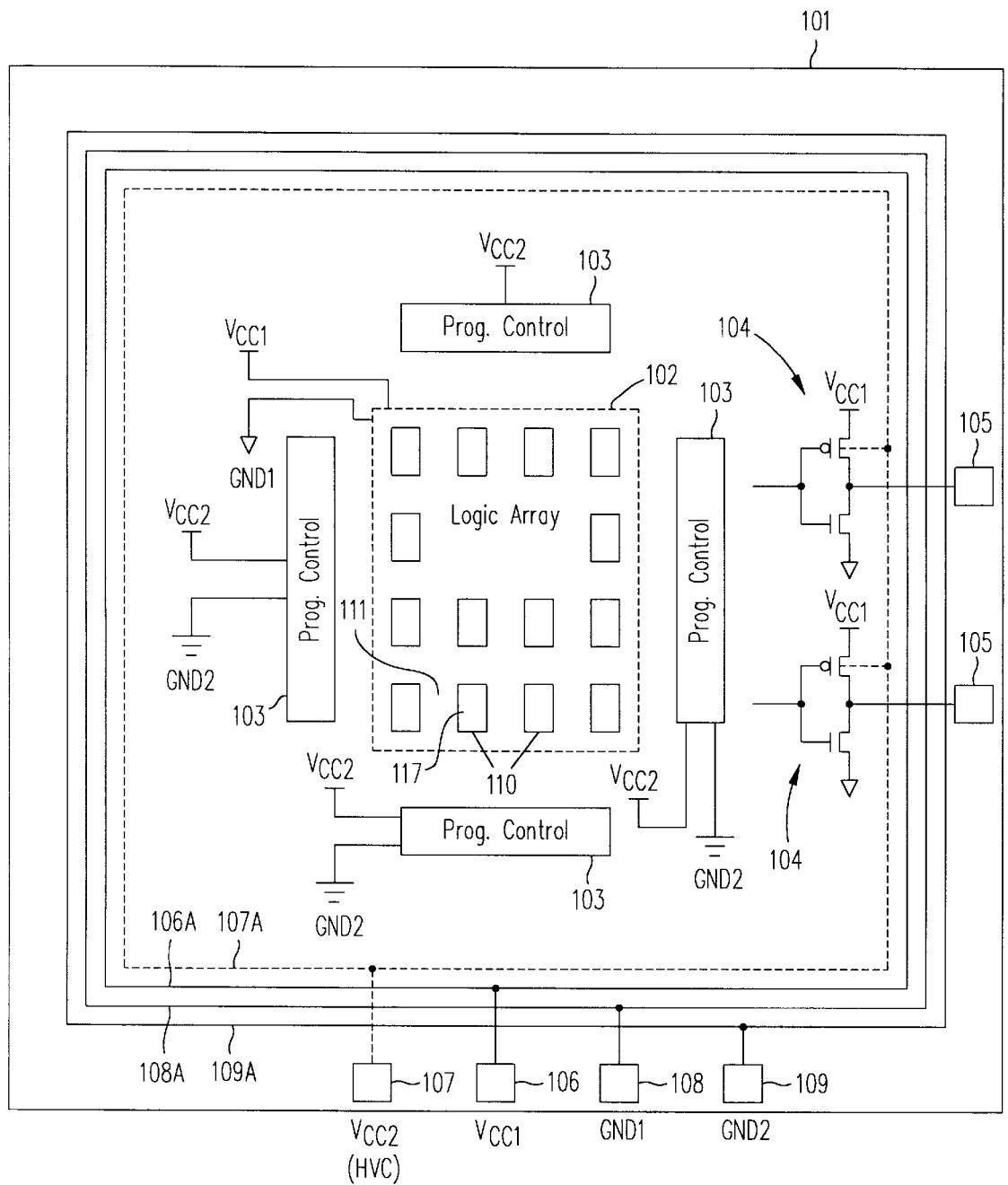
FIG. 9 is a simplified top-down diagram of an antifuse-based field programmable gate array in accordance with an embodiment of the present invention.

FIG. 9 is a simplified top-down diagram of a field programmable gate array (FPGA) 101 in accordance with an embodiment of the present invention. FPGA 101 includes a logic array 102, programming control circuits 103, output drivers 104 and output terminals 105, a first supply voltage power input terminal (VCC1) 106, a second supply voltage power input terminal (VCC2) 107, a first ground terminal (GND1) 108, and a second ground terminal (GND2) 109. Logic array 102 includes a plurality of logic modules 110 arranged in rows and columns as well as a programmable interconnect structure 111 employing antifuses disposed in the spaces between the logic modules.

First supply voltage power input terminal (VCC1) 106 is coupled to the logic array 102 to supply power to the logic array 102. Second supply voltage power input terminal (VCC2) 107 is coupled to the program control circuits 103 to supply power to the program control circuits 103. First supply voltage power input terminal (VCC1) is electrically isolated from the second supply voltage power input terminal (VCC2) such that programming control circuits can be powered during antifuse programming via the second supply voltage power input terminal (VCC2) when the digital logic of the logic modules of the logic array 102 is left unpowered.

Figure 10:
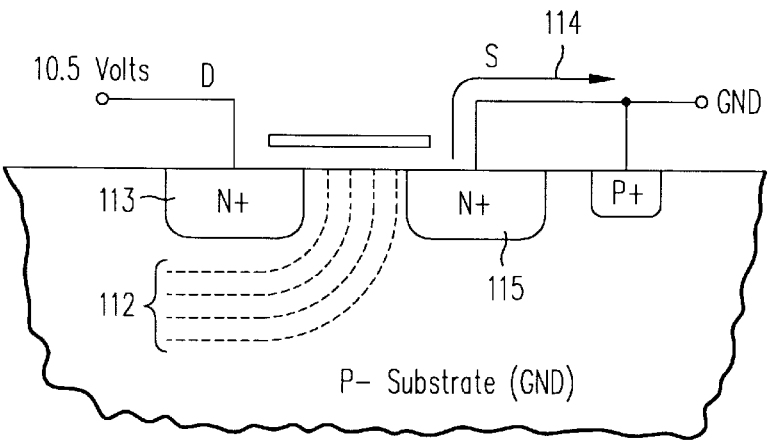
FIG. 10 is a simplified diagram illustrating a potential problem associated with logic module output devices.

FIG. 10 is a cross-sectional diagram illustrating a potential problem when the sources of the N-channel pull-down transistors of the logic module output devices are coupled to ground potential during antifuse programming. Because the drain of the logic module output device may be driven with the programming voltage (for example, 10.5 volts) during antifuse programming, the depletion region 112 around the drain region 113 may grow to where drain-to-source punch through occurs. A punch through current 114 may flow from source region 115.

Figure 11:
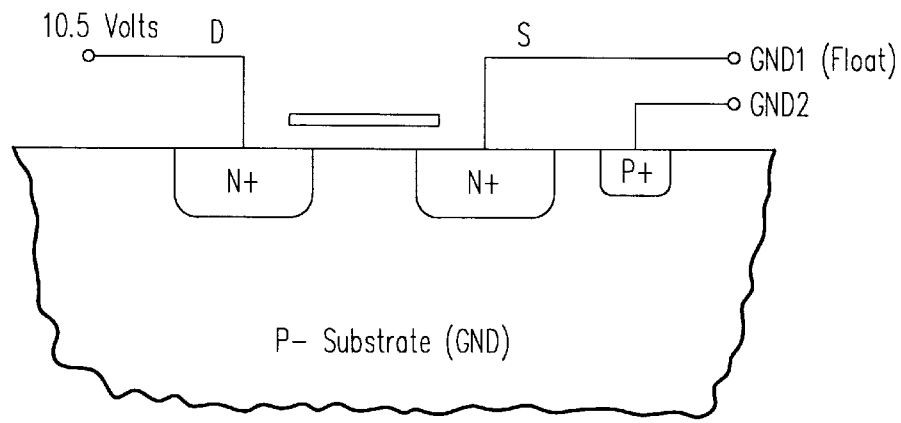
FIG. 11 is a simplified diagram illustrating a solution to the potential problem illustrated in FIG. 10.

FIG. 11 is a simplified diagram illustrating a solution to the problem illustrated in FIG. 10 whereby the punch through current path is broken by the use of two electrically isolated ground terminals. First ground terminal (GND1) 108 is coupled to ground the digital logic of the logic modules of logic array 102. Terminal GND1 may be coupled to the sources of the N-channel pull-down transistors of the logic module output devices circuitry as illustrated in FIG. 11.

Second ground terminal (GND2) 109 is coupled to ground the digital logic of the programming control circuits 103 and to ground the substrate of the entire integrated circuit 101 (substrate for the logic array 102 as illustrated in FIG. 11, substrate for the programming control circuits 103, and substrate for the output drivers 104). Terminal GND2 may be coupled to the sources of the N-channel pull-down transistors of the digital logic circuitry of the programming control circuits 103. First ground terminal GND1 is electrically isolated from the second ground terminal GND2 such that logic array ground can be left floating by leaving first ground terminal GND1 floating during antifuse programming when the programming control circuitry ground is grounded via second ground terminal (GND2).

In the embodiment of FIG. 9, there are four power buses running around the periphery of integrated circuit 101. One power bus 106A is coupled to first power input terminal VCC1 106, another power bus 107A is coupled to second power input terminal VCC2 107, another power bus 108A is coupled to first ground terminal GND1 108, and another power bus 109A is coupled to second ground terminal GND2 109. These four power buses form part of the power grid of the integrated circuit 101. There are numerous power conductors (now shown) extending from these peripheral buses to locations requiring such voltages in the interior of the integrated circuit. In one specific embodiment, there are ten VCC1 terminals, two VCC2 terminals, eight GND1 terminals, and two GND2 terminals.

Figure 1:
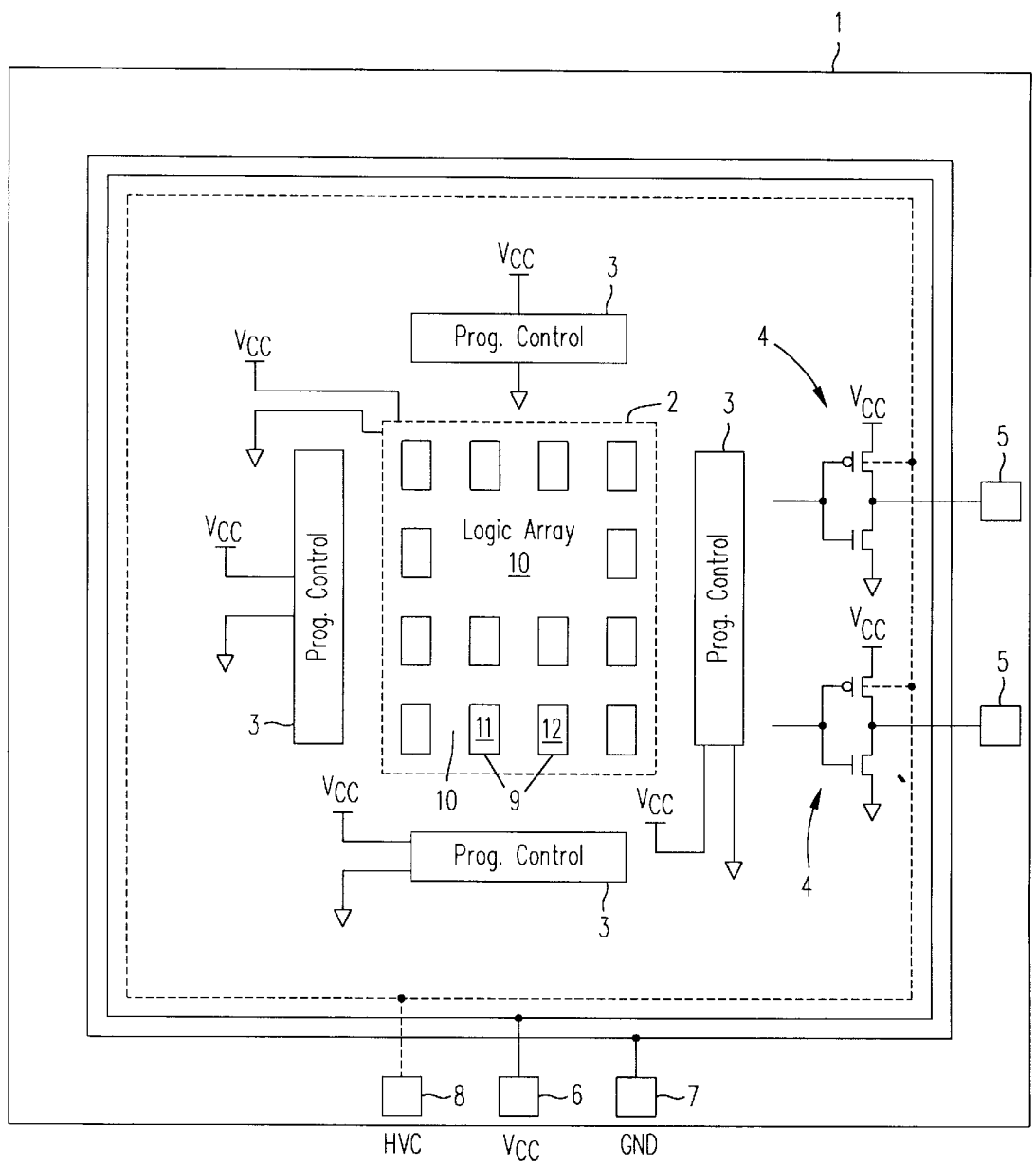
FIG. 1 (Prior Art) is a simplified top-down diagram of a conventional antifuse-based field programmable gate array (FPGA).
Figure 2:
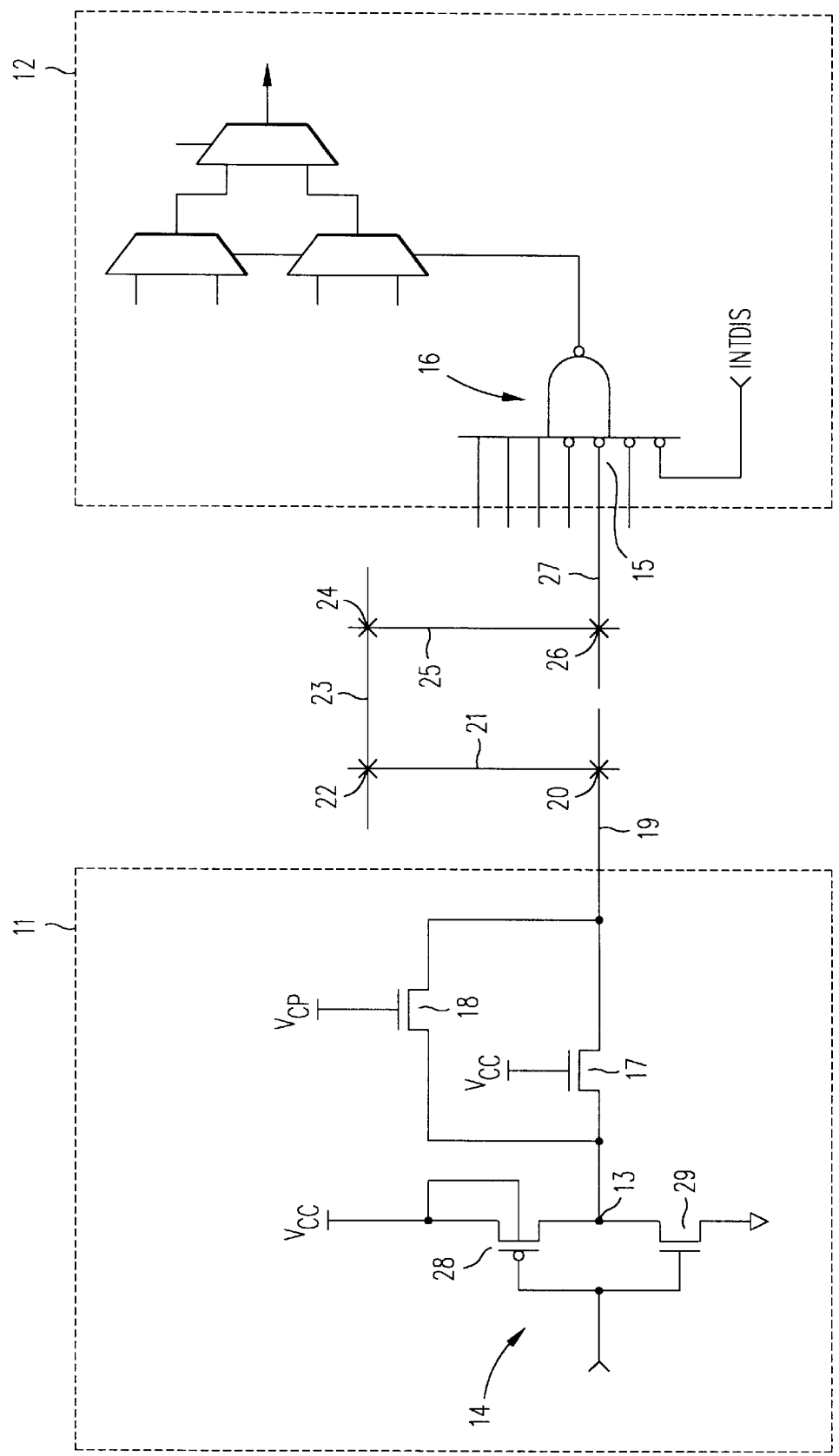
FIG. 2 (Prior Art) is a simplified diagram of parts of two logic modules of the conventional FPGA of FIG. 1.
Figure 3:
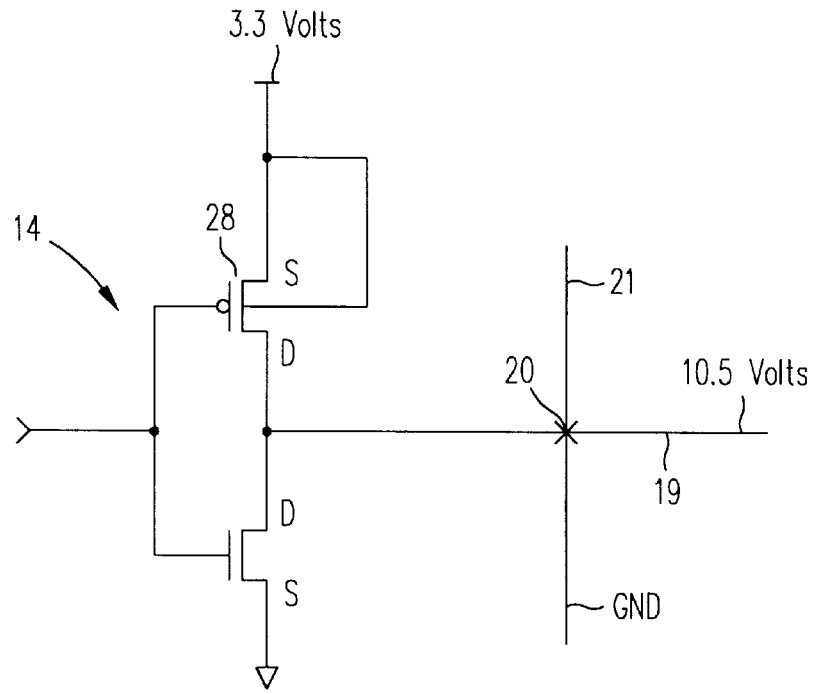
FIG. 3 is a simplified diagram illustrating a problem associated with programming an antifuse in the conventional FPGA of FIG. 1 if high voltage logic module output protection transistors are not provided.
Figure 4:
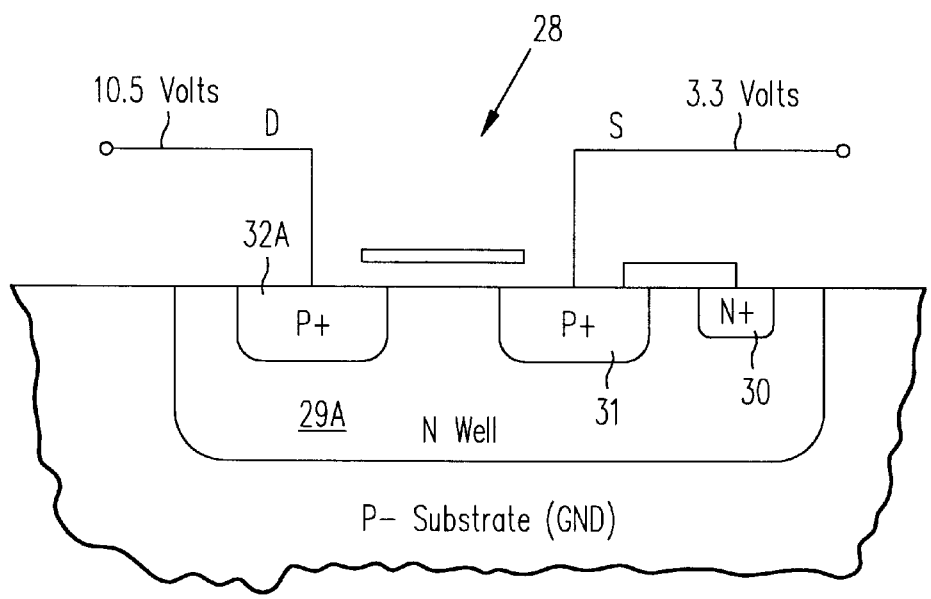
FIG. 4 is a cross-sectional diagram of the P-channel pull-up transistor of FIG. 3.
Figure 5:
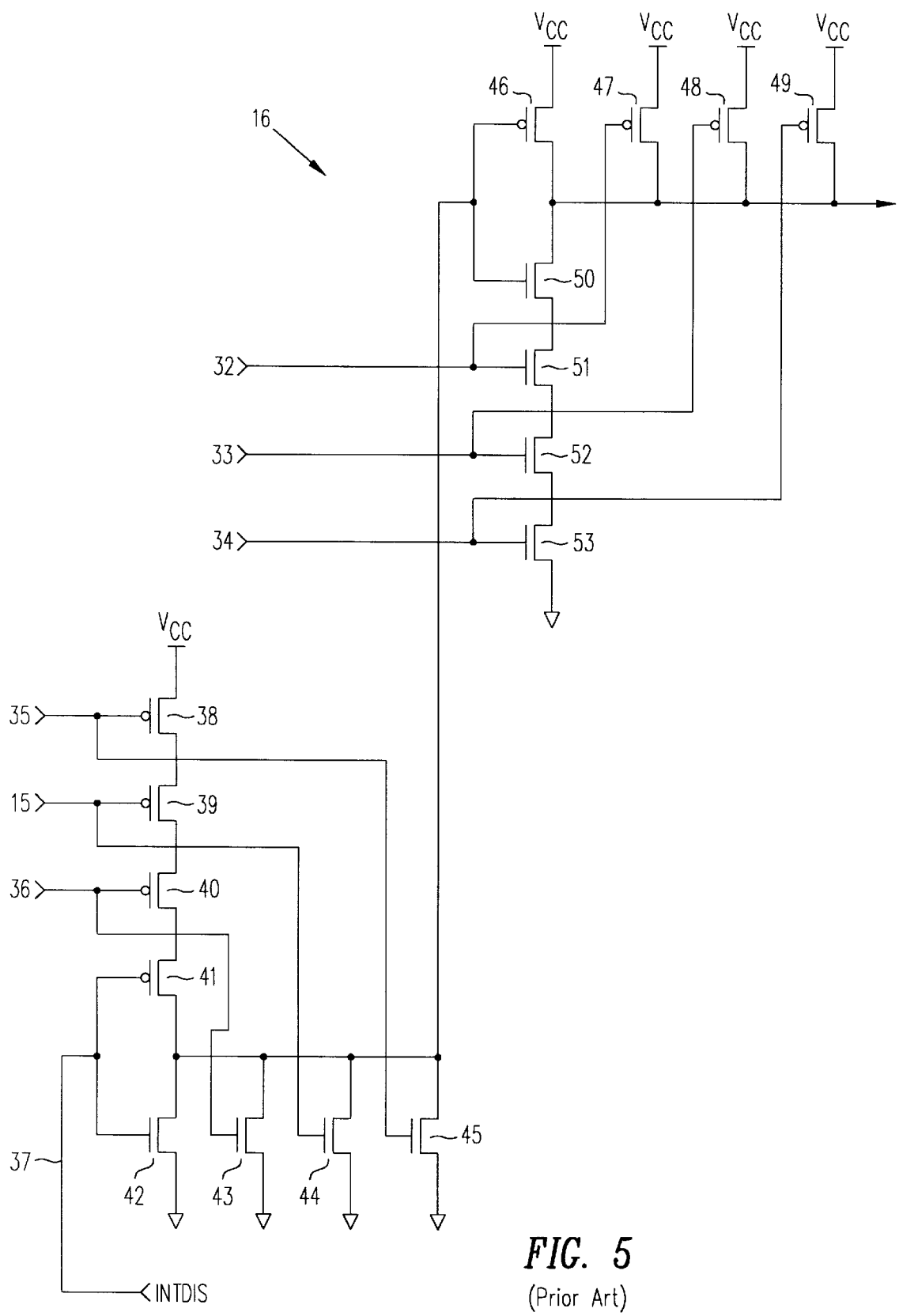
FIG. 5 (Prior Art) is a transistor level diagram of a logic module input device of FIG. 2.
Figure 12:
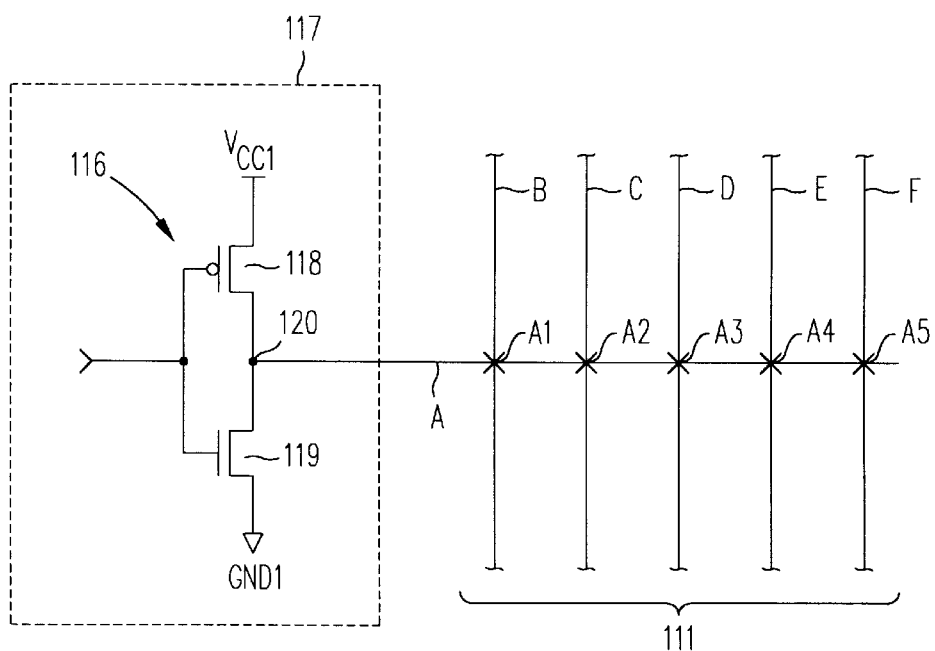
FIG. 12 is a transistor level diagram of a logic module output device and the signal conductor it drives.

FIG. 12 is a diagram of an output device 116 of logic module 117 of FIG. 9. Output device 116 includes a P-channel pull-up transistor 118 and an N-channel pull-down transistor 119. This output device 116 may, for example, be the output device driving the Q output of a flip-flop of logic module 117. The drain of transistor 118 is coupled to the drain of transistor 119 at logic module output node 120. Signal conductor A extends to the right from output node 120 into the interconnect structure 111 to cross vertical signal conductors B, C, D, E and F. Cross antifuses A1, A2, A3, A4 and A5 are disposed at locations where signal conductor A crosses signal conductors B, C, D, E and F, respectively. There is no transistor disposed in the signal path from output node 120 to antifuse A2, nor is there any transistor coupled to signal conductor A between output node 120 and antifuse A2. There also are no pass antifuses through which a signal passing from output node 120 to vertical conductor A2 must pass. Because there are no logic module output protection transistors, there is no charge pump on the integrated circuit that operates during normal circuit operation. Consequently the total standby current consumption during normal circuit operation can be made less than 250 microamperes maximum over the 0–70 degrees Celsius range, all of this current being due to leakage. The antifuses of FPGA 101 may be of any suitable type including amorphous silicon antifuses, oxide-nitride-oxide antifuses, antifuses where the dielectric through which a conductive filament forms is disposed in a via, and antifuses where the dielectric through which a conductive filament forms is disposed above a conductive plug. For antifuse structures see: U.S. Pat. No. 5,502,315, U.S. Pat. No. 5,362,676, and U.S. Pat. No. 5,557,136 (the subject matter of these patents is incorporated herein by reference). Any suitable logic module can be employed for logic module 117 including the logic module of FIG. 3E of U.S. Pat. No. 5,424,655 (the subject matter of which is incorporated herein by reference) and the logic module circuitry disclosed in the complete hierarchical schematic of the microfiche appendix of U.S. patent application Ser. No. 08/667,702 entitled "Programming Architecture For A Programmable Integrated Circuit Employing Antifuses" by Paige A. Kolze, filed Jun. 21, 1996, now U.S. Pat. No. 5,825,201, issued Oct. 20, 1998 (the subject matter of which is incorporated herein by reference).

EXAMPLE 1

The first supply voltage power input terminal (VCC1) and the first ground terminal (GND1) are left floating during antifuse programming while the programming control circuits 103 are powered via second supply voltage power input terminal (VCC2). Second ground terminal (GND2) is grounded during antifuse programming and during normal circuit operation.

Figure 6:
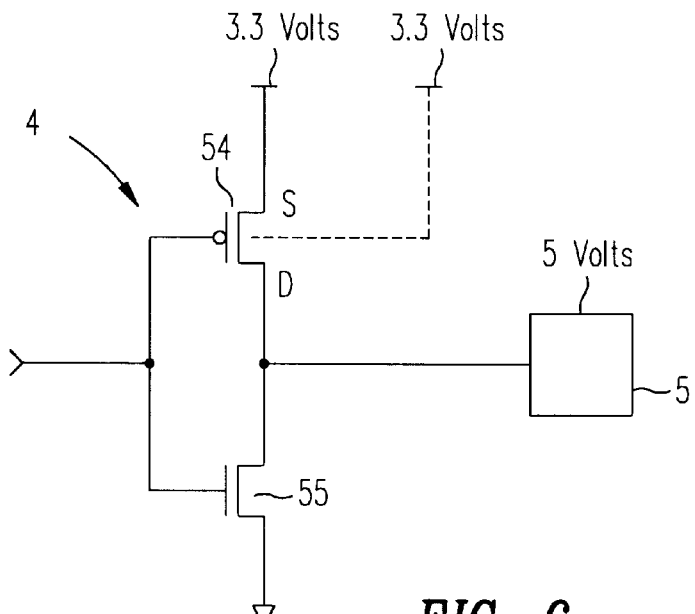
FIG. 6 (Prior Art) is a simplified diagram illustrating a high voltage compatibility problem associated with external logic driving high voltages onto FPGA terminals.
Figure 7:
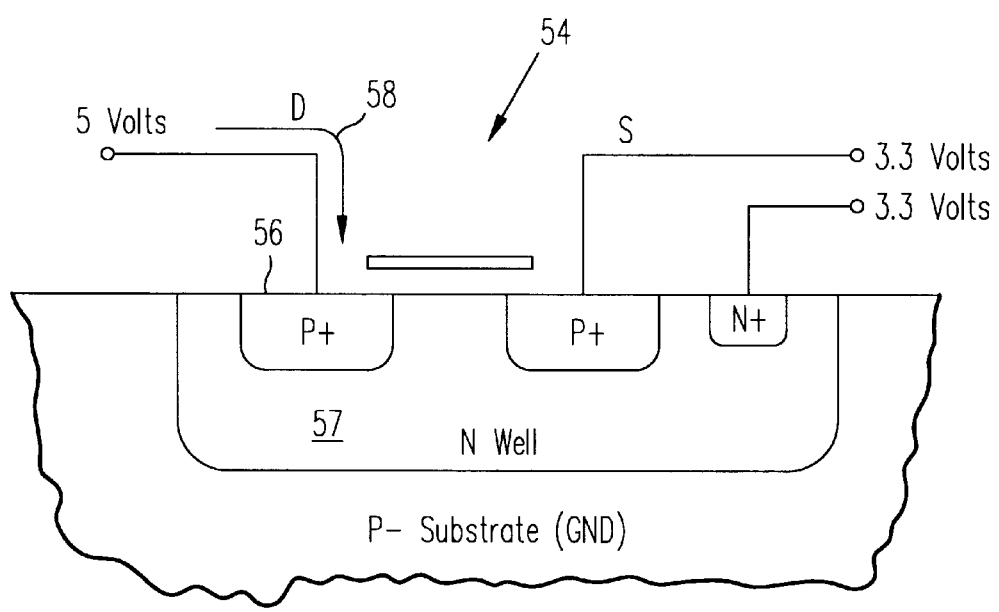
FIG. 7 is a cross-sectional diagram of a P-channel pull-up transistor in an output driver of FIG. 6.
Figure 8:
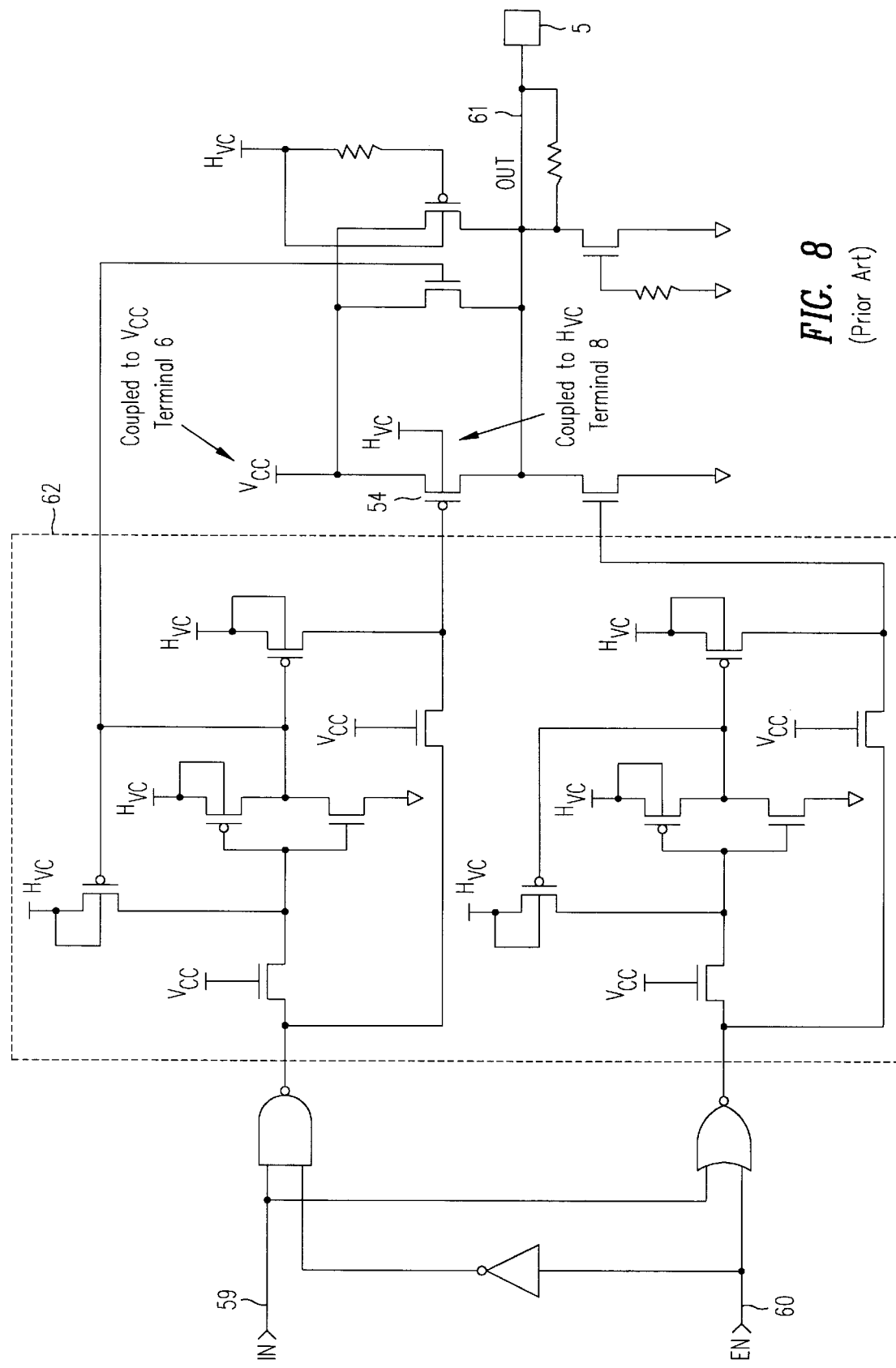
FIG. 8 (Prior Art) is a circuit diagram of an output driver of the FPGA of FIG. 1.

In some embodiments, the second supply voltage power input terminal (VCC2) 107 is a high voltage compatible (HVC) power input terminal. VCC2 terminal 107 may, for example, be coupled to the semiconductor body of the P-channel pull-up transistors of the output drivers 104 of the FPGA. In this way, VCC2 terminal 107 can be coupled to a high voltage (for example, 5.0 volts) to which external circuitry may drive terminals 105 such that the problem illustrated in FIGS. 6 and 7 does not occur. If, on the other hand, external circuitry will not be driving terminals of the FPGA to such a high digital logic high voltage, then VCC2 terminal 107 can be coupled to the supply voltage VCC (for example, 3.3 volts) during normal circuit operation.

EXAMPLE 2

The first supply voltage power input terminal (VCC1) and the first ground terminal (GND1) are both coupled to the same potential (such as both grounded or both coupled to supply voltage VCC) during antifuse programming. The programming control circuits 103, on the other hand, are powered via second supply voltage power input terminal (VCC2) during antifuse programming. Second ground terminal (GND2) is grounded during antifuse programming and during normal circuit operation.

EXAMPLE 3

Only one of the first supply voltage power input terminal (VCC1) and the first ground terminal (GND1) is floated during antifuse programming. If the first supply voltage power input terminal (VCC1) is floated, then the first ground terminal GND1 is grounded (for example, coupled to second ground terminal GND2). If the first ground terminal (GND1) is floated, then the first supply voltage power input terminal (VCC1) is coupled to supply voltage VCC (for example, 3.3 volts). The programming control circuits 103, on the other hand, are powered via second power supply voltage power input terminal (VCC2) during antifuse programming when the second ground terminal (GND2) is grounded.

EXAMPLE 4

The first supply voltage power input terminal (VCC1) and the first ground terminal (GND1) are both coupled during antifuse programming to the same potential that is greater than supply voltage VCC but is less than the programming voltage Vpp. The programming control circuits 103, on the other hand, are powered during antifuse programming via second power voltage supply input terminal (VCC2). Second ground terminal (GND2) is grounded during antifuse programming.

In example four, the field programmable gate array still requires output protection transistors but the internal disable signal is omitted and the two associated transistors in each of the many logic module input devices are also omitted. Removing the two transistors from each logic module input device results in considerable space savings because there are so very many logic module input devices on the field programmable gate array. In one embodiment, terminals VCC1 and GND1 are coupled to approximately 5.5 volts during antifuse programming (for an FPGA, the digital logic of which ordinarily operates from a 3.3 supply voltage and which receives a 10.5 volt programming voltage).

Moreover, the other input transistors of the logic module input devices can be made smaller because the maximum gate-to-source voltage that the logic module input device transistors experience is reduced. If the sources of the P-channel pull-up input transistors and the sources of the N-channel pull-down input transistors of the logic module input devices are floating as in example one at, for example, zero volts, then the programming voltage (for example, 10.5 volts) will be present between the gates and sources of these input transistors. The logic module input transistors could be made to have a thicker gate insulator so that they could withstand this large gate-to-source voltage, but such a thicker gate insulator would generally require a larger gate length and a larger gate width in order to maintain the same logic module input transistor performance. If however as in example four, the sources of the pull-up and pull-down input transistors of the logic module input devices are coupled together and tied to a potential greater than supply voltage VCC, then the largest gate-to-source voltage that will be present on the input transistors during antifuse programming will be smaller and the input transistors will not need to be made to withstand greater gate-to-source voltages. The many logic module input transistors can therefore be relatively small transistors that have the same gate-to-source breakdown voltage as the other transistors of the digital logic in the logic modules. Because the gate insulator thicknesses of all the transistors in the logic modules are the same, the manufacturing process used to make the field programmable gate array has fewer processing steps.

Although example four is described above where the first supply voltage power input terminal (VCC1) and the first ground terminal (GND1) are both coupled to a potential greater than supply voltage VCC, the described advantages may also be realized by coupling terminals VCC1 and GND1 to a potential that is between supply voltage VCC and ground potential.

In the embodiment of FIG. 9, external circuitry is used to float the first power input terminal VCC1 106 and to power the second power input terminal VCC2 107 during antifuse programming. A programming board coupled to and controlled by a personal computer can serve this purpose. A particular programming board called DeskFab available from QuickLogic Corporation, 1277 Orleans Drive, Sunnyvale, Calif. 94089 (408)-990-4000 is suitable. Alternatively, circuitry can be provided on-chip to float logic array power during antifuse programming. In one exemplary embodiment, rather that providing a separate power input terminal VCC2 107, a field effect transistor is disposed in the VCC power supply line between power input terminal 106 and logic array 102. The gate of this transistor is coupled to the programming circuitry such that a signal indicative of being in the programming mode is supplied to the gate of the transistor and such that the transistor is nonconductive in the programming mode.

In some embodiments, the FPGA is tested once in a test mode during wafer sort and then once again in the test mode after packaging. If the FPGA passes these tests, it is then put into programming mode for configuration of the programmable interconnect. In test mode, the input leads of the logic module input devices are set up with data prior to the application of array power such that the power up current surge problem due to floating logic module input leads is not present. Special test antifuses are, however, programmed in the test mode in some embodiments. Accordingly, precautions in accordance with the present invention are taken to avoid damaging logic module output devices during the test mode. See the following U.S. patent applications (the subject matter of which is incorporated herein by reference) for further details on the test mode and associated circuitry and methods: 08/754,461 entitled "Security Antifuse That Prevents Readout Of Some But Not Other Information From A Programmed Field Programmable Gate Array" filed Nov. 21, 1996 by James M. Apland, et al., now U.S. Pat. No. 5,898,776, issued Apr. 27, 1999; and 08/667,702 entitled "Programming Architecture For A Programmable Integrated Circuit Employing Antifuses" filed Jun 21, 1996 by Paige A. Kolze, now U.S. Pat. No. 5,825,201, issued Oct. 20, 1998.

Although the present invention is described in connection with certain specific embodiments for instructional purposes, the present invention is not limited thereto. The particular logic module input devices and output devices set forth above are merely illustrative. Although the invention is described above in connection with a three multiplexer and flip-flop type logic module, no particular type of logic module need be used. The logic modules of the logic array may abut each other and have no intervening routing channels, the interconnect structure being disposed above the logic modules in overlaying metal and antifuse layers. Although the specific embodiments are realized in CMOS circuitry, it is understood that other types of circuitry can be employed including BiCMOS circuitry. Although the illustrated process involves a P-type substrate with P-channel transistors disposed in N wells, other processes can be used including a twin-tub process where both P-channel and N-channel transistors are disposed in wells. In such a case, the semiconductor bodies of N-channel transistors in the logic array can be biased at a different potential from the semiconductor bodies of N-channel transistors in the programming control circuits and I/O cells. Accordingly, various modifications, adaptations, and combinations of various features of the described embodiments can be practiced without departing from the scope of the invention as set forth in the claims.

What is claimed is:

1. An integrated circuit, comprising:
   a logic array, comprising an array of logic modules and a programmable interconnect structure employing antifuses;
   a programming control circuit;
   a first power input terminal VCC1 coupled to digital logic in said logic modules of said logic array; and
   a second power input terminal VCC2 coupled to said programming control circuit and being electrically isolated from said first power input terminal VCC1.

2. The integrated circuit of claim 1, wherein said digital logic in said logic modules includes P-channel pull-up transistors, said first power input terminal VCC1 being coupled to sources of said P-channel pull-up transistors of said logic modules, and wherein said programming control circuit includes P-channel pull-up transistors, said second power input terminal VCC2 being coupled to sources of said P-channel pull-up transistors of said programming control circuit.

3. The integrated circuit of claim 2, further comprising a ground terminal GND, said digital logic in said logic modules also including N-channel pull-down transistors formed in a semiconductor body, said ground terminal GND being coupled to said semiconductor body.

4. The integrated circuit of claim 3, wherein said programming control circuit also includes N-channel pull-down transistors formed in a semiconductor body, said ground terminal GND also being coupled to said semiconductor body of said N-channel pull-down transistors of said programming control circuit.

5. The integrated circuit of claim 1, wherein said second power input terminal VCC2 is electrically isolated from said first power input terminal VCC1 such that said digital logic in said logic modules can be unpowered when said programming control circuit is powered via said second power input terminal VCC2.

6. The integrated circuit of claim 1, further comprising:
   a programming voltage input terminal VPP for receiving a programming voltage Vpp; and
   a ground terminal GND, said digital logic in said logic modules being capable of operation in a normal operating mode when a voltage V1 of a magnitude less than said programming voltage Vpp is on said first power input terminal VCC1 (relative to ground terminal GND).

7. The integrated circuit of claim 6, wherein digital logic in said programming control circuit is capable of operation in a programming mode when a voltage V2 of magnitude less than said programming voltage Vpp is on said second power input terminal VCC2 (relative to ground terminal GND).

8. The integrated circuit of claim 7, wherein V1 is substantially equal to V2.

9. The integrated circuit of claim 7, wherein V1 is less than V2.

10. The integrated circuit of claim 9, wherein V1 is approximately 3.3 volts and V2 is approximately 5.0 volts.

11. The integrated circuit of claim 9, wherein V1 is approximately 2.5 volts and V2 is approximately 3.3 volts.

12. The integrated circuit of claim 1, further comprising:
    an output driver cell coupled to drive an output terminal of said integrated circuit, said output driver having a transistor formed in a well, the second power input terminal VCC2 being coupled to said well.

13. The integrated circuit of claim 1, further comprising:
    a first ground terminal GND1 coupled to digital logic in said logic modules of said logic array; and
    a second ground terminal GND2 coupled to digital logic in said programming control circuit, said second ground terminal GND2 being electrically isolated from said first ground terminal GND1.

14. The integrated circuit of claim 13, wherein said digital logic in said logic modules includes N-channel pull-down transistors, said first ground terminal GND1 being coupled to sources of said N-channel pull-down transistors of said logic modules, and wherein said digital logic in said programming control circuit includes N-channel pull-down transistors, said second ground terminal GND2 being coupled to sources of said N-channel pull-down transistors of said programming control circuit.

15. A method, comprising:
    programming antifuses in a logic array of a programmable device, said logic array comprising digital logic in logic modules, said digital logic being unpowered during said programming; and
    after said programming, powering said digital logic in said logic modules during normal circuit operation.

16. The method of claim 15, wherein said programmable device further comprises a programming control circuit, said programming control circuit being powered during said programming.

17. The method of claim 15, wherein said programmable device has a first power input terminal VCC1 and a second power input terminal VCC2, said first power input terminal VCC1 being electrically isolated from said second power input terminal VCC2 during said programming, said method further comprising:

floating said first power input terminal VCC1 during said programming and powering said second power input terminal VCC2 during said programming; and powering both said first power input terminal VCC1 and said second power input terminal VCC2 during said normal circuit operation.

18. The method of claim 15, further comprising:

decoupling said digital logic in said logic modules from a power input terminal of said programmable device during said programming; and coupling said digital logic in said logic modules to said power input terminal during said normal circuit operation.

19. The method of claim 17, wherein said second power input terminal VCC2 is a high voltage compatibility terminal means for making said programmable device capable of interfacing with outside logic that drives a voltage onto terminals of said programmable device which is greater than a supply voltage supplied onto said first input terminal VCC1 during normal circuit operation.

20. The method of claim 17, wherein said first power input terminal VCC1 and said second power input terminal VCC2 are supplied with the same supply voltage during said normal circuit operation.

21. The method of claim 15, wherein said programmable device has a first ground terminal GND1 and a second ground terminal GND2, said method further comprising:

floating said first ground terminal GND1 during said programming and grounding said second ground terminal GND2 during said programming; and grounding both said first and second ground terminals GND1 and GND2 during said normal circuit operation.

22. The method of claim 15, wherein said programmable device has a first power input terminal VCC1, a second power input terminal VCC2, a first ground terminal GND1 and a second ground terminal GND2, said method further comprising:

coupling said first power input terminal VCC1 to said first ground terminal GND1 during said programming, powering said second power input terminal VCC2 during said programming, and grounding said second ground terminal GND2 during said programming; and powering said first and second power input terminals VCC1 and VCC2 during said normal circuit operation and grounding said first and second ground terminals GND1 and GND2 during said normal circuit operation.

23. The method of claim 22, wherein said first power input terminal VCC1 and said first ground terminal GND1 are coupled together to a non-ground potential during said antifuse programming.

24. The method of claim 23, wherein said non-ground potential is greater than a supply voltage VCC and less than a programming voltage Vpp.

25. The method of claim 23, wherein said non-ground potential is smaller than or equal to a supply voltage VCC, and greater than ground potential.

26. The method of claim 15, wherein said digital logic includes logic module input transistors, logic module output transistors, and other logic module transistors, said logic module input transistors having a gate-to-source breakdown voltage, said other logic module transistors having a gate-to-source breakdown voltage, said gate-to-source breakdown voltage of said logic module input transistors being substantially identical to said gate-to-source breakdown voltage of said other logic module transistors.

27. The method of claim 15, wherein said digital logic modules include logic module input transistors, logic module output transistors, and other logic module transistors, said logic module input transistors having a gate insulator thickness that is substantially identical to a gate insulator thickness of said other logic module transistors.

28. An integrated circuit comprising a programmable interconnect structure employing antifuses and a plurality of logic modules, each of said logic modules having an output device, each output device comprising a pull-up transistor and a pull-down transistor, the pull-up transistor and the pull-down transistor being coupled together at a logic module output node, a signal conductor A extending from the logic module output node and to a first antifuse A1 in the interconnect structure and then to a second antifuse A2 in the interconnect structure, said first antifuse A1 being programmable to connect signal conductor A to a signal conductor B, said second antifuse A2 being programmable to connect signal conductor A to signal conductor C, said signal conductor A comprising no high voltage isolation transistor such that a signal passing from said output node to said second antifuse A2 passes through no transistor, no transistor being coupled to said signal conductor A between said logic module output node and said second antifuse A2.

29. The integrated circuit of claim 28, wherein said integrated circuit includes no charge pump circuit that operates during normal circuit operation.

30. The integrated circuit of claim 28, wherein said integrated circuit has a standby current consumption of less than 250 microamperes maximum over a 0–70 degrees Celsius range.

31. An integrated circuit, comprising:

a logic array including logic modules and a programmable interconnect structure employing antifuses; and means for programming antifuses in said programmable interconnect structure to realize a user-specific circuit without powering digital logic in said logic modules during said programming.

32. The integrated circuit of claim 31, wherein said integrated circuit includes no charge pump that operates during normal circuit operation.

33. The integrated circuit of claim 31, wherein said integrated circuit includes no logic module output protection transistors.

34. The integrated circuit of claim 31, wherein said logic modules include logic module input transistors, logic module output transistors, and other transistors, said logic module input transistors having a gate insulation thickness that is substantially the same as a gate insulation thickness of said other transistors of said logic modules.

35. A programmable device, comprising:

a logic array comprising digital logic and a programmable interconnect structure employing antifuses; and means for powering said digital logic during normal operation with a standby current consumption of less than 250 microamperes maximum over a temperature range of 0–70 degrees Celsius.

36. The programmable device of claim 35, wherein said means includes a first supply voltage power input terminal VCC1 and a second supply voltage power input terminal VCC2, said first supply voltage power input terminal VCC1 being coupled to supply power to said logic array and not to another part of said programmable device, said second supply voltage power input terminal VCC2 being coupled to supply power to said other part of said programmable device and not to said logic array.

37. The programmable device of claim 36, wherein said other part is a programming control circuit.

* * * * *